United States Patent
Hayami et al.

(10) Patent No.: US 7,030,026 B2
(45) Date of Patent: Apr. 18, 2006

(54) SEMICONDUCTOR DEVICE FABRICATION METHOD

(75) Inventors: Yuka Hayami, Kawasaki (JP); Junji Oh, Kawasaki (JP); Takashi Saiki, Kawasaki (JP); Masataka Kase, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 202 days.

(21) Appl. No.: 10/695,874

(22) Filed: Oct. 30, 2003

(65) Prior Publication Data

US 2004/0102047 A1 May 27, 2004

(30) Foreign Application Priority Data

Oct. 31, 2002 (JP) ............................. 2002-317598

(51) Int. Cl.
*H01L 21/302* (2006.01)
(52) U.S. Cl. .............. 438/706; 438/725; 510/175; 134/1.1
(58) Field of Classification Search ............... 438/706, 438/710, 712, 714, 719, 723, 725, 745; 210/175, 210/176; 134/1.1, 1.2, 1.3
See application file for complete search history.

(56) References Cited

U.S. PATENT DOCUMENTS

| | | | | |
|---|---|---|---|---|
| 5,770,494 A | * | 6/1998 | Yamamoto et al. | 438/232 |
| 5,830,788 A | * | 11/1998 | Hiroki et al. | 438/199 |
| 6,031,268 A | * | 2/2000 | Hiroki et al. | 257/345 |
| 6,083,780 A | * | 7/2000 | Yasuda | 438/162 |
| 6,255,152 B1 | * | 7/2001 | Chen | 438/199 |
| 6,479,350 B1 | * | 11/2002 | Ling et al. | 438/265 |
| 6,677,194 B1 | * | 1/2004 | Yamanaka et al. | 438/199 |
| 6,872,624 B1 | * | 3/2005 | Odake et al. | 438/264 |
| 6,897,118 B1 | * | 5/2005 | Poon et al. | 438/303 |

FOREIGN PATENT DOCUMENTS

| | | |
|---|---|---|
| JP | 6-204243 | 7/1994 |
| JP | 6-209081 | 7/1994 |

* cited by examiner

*Primary Examiner*—Kin-Chan Chen
(74) *Attorney, Agent, or Firm*—Westerman, Hattori, Daniels & Adrian, LLP

(57) ABSTRACT

The semiconductor device fabrication method comprises the step of forming electrodes 20 in a first element region 14n and in a second element region 14p; the step of forming a first resist film 22 which is opened in the first element region 14n; the step of forming a first dopant diffused region 28 with the first resist film 22 and the gate electrode 20 as a mask; the first ashing processing step of ashing the first resist film 22; the step of forming a sidewall insulation film 42 over the side wall of the gate electrode 20; the step of forming a second resist film 44 which is opened in the first element region 14n; the forming a second dopant diffused region 48 with the second resist film 44, the gate electrode 20 and the sidewall insulation film 42 as a mask; and the second ashing processing step for ashing the second resist film 44. The ashing processing period of time in the first ashing processing step is shorter than the ashing processing period of time in the second ashing processing step.

16 Claims, 15 Drawing Sheets

SEMICONDUCTOR DEVICE FABRICATION METHOD

CROSS-REFERENCE TO RELATED APPLICATION

This application is based upon and claims priority of Japanese Patent Application No. 2002-317598, filed on Oct. 31, 2002, the contents being incorporated herein by reference.

BACKGROUND OF THE INVENTION

The present invention relates to a semiconductor device fabrication method.

When a semiconductor device has the shorter channel length decreased by the micronization, short channel effect becomes conspicuous, and the MOS transistors cannot normally operate. As a technique for preventing the short channel effect, semiconductor devices having extension source/drain structure are recently noted.

When the extension region of a PMOS transistor is formed, the region for an NMOS transistor to be formed in is covered with a photoresist film, and a dopant is implanted into the semiconductor substrate with the gate electrode and a photoresist film as the mask to form the extension region. Then, the photoresist film is released.

On the other hand, when the extension region of the NMOS transistor is formed, the region for the PMOS transistor formed in is covered with a photoresist film, and a dopant is implanted into the semiconductor substrate with the gate electrode and the photoresist film as the mask to form the extension region. Then, the photoresist film is released.

The MOS transistor of the extension source/drain structure can suppress the short channel effect, which makes it possible to provide further micronized semiconductor devices.

Following references disclose the background art of the present invention.

[Patent Reference 1]
Specification of Japanese Patent Application Unexamined Publication No. Hei 6-204243
[Patent Reference 2]
Specification of Japanese Patent Application Unexamined Publication No. Hei 6-209081

However, when a photoresist film is removed, ashing processing and chemical liquid processing are performed. In the ashing processing, the extension region is oxidized. In the chemical liquid processing, the extension region is oxidized and etched. Accordingly, the electric resistance of the extension region tends to become higher. A technique for suppressing the electric resistance of the extension region to be low is expected.

SUMMARY OF THE INVENTION

An object of the present invention is to provide a semiconductor device fabrication method which can suppress the electric resistance of the extension region.

According to one aspect of the present invention, there is provided a method for fabricating a semiconductor device comprising: the step of forming gate electrodes respectively in a first element region and in a second element region which are formed over a semiconductor substrate, with a gate insulation film formed therebetween; the step of forming a first resist film over the semiconductor substrate and the gate electrodes, the first resist film being opened in the first element region; the step of implanting a dopant in the first element region with the first resist film and the gate electrodes as a mask to form a first dopant diffused region; the first ashing processing step of ashing the first resist film; the step of forming a sidewall insulation film over the side wall of the gate electrode; the step of forming a second resist film over the semiconductor substrate, the gate electrode and the sidewall insulation film, the second resist film being opened in the second element region; the step of implanting a dopant in the first element region with the second resist film, the gate electrode and the sidewall insulation film as a mask to form a second dopant diffused region; and the second ashing processing step of ashing the second resist film, an ashing processing period of time in the first ashing processing step being shorter than an ashing processing period of time in the second ashing processing step.

According to another aspect of the present invention, there is provided a method for fabricating a semiconductor device comprising: the step of forming gate electrodes respectively in a first element region and in a second element region which are formed over a semiconductor substrate, with a gate insulation film formed therebetween; the step of forming a first resist film over the semiconductor substrate and the gate electrodes, the first resist film being opened in the first element region; the step of implanting a dopant in the first element region with the first resist film and the gate electrodes as a mask to form a first dopant diffused region; the first ashing processing step of ashing the first resist film with a reaction gas of oxygen; the step of forming a sidewall insulation film over the side wall of the gate electrode; the step of forming a second resist film over the semiconductor substrate, the gate electrode and the sidewall insulation film, the second resist film being opened in the second element region; the step of implanting a dopant in the first element region with the second resist film, the gate electrode and the sidewall insulation film as a mask to form a second dopant diffused region; and the second ashing processing step of ashing the second resist film with a mixed gas mixing a reaction gas of oxygen and another reaction gas.

According to further another aspect of the present invention, there is provided a method for fabricating a semiconductor device comprising: the step of forming gate electrodes respectively in a first element region and in a second element region which are formed over a semiconductor substrate, with a gate insulation film formed therebetween; the step of forming a first resist film over the semiconductor substrate and the gate electrodes, the first resist film being opened in the first element region; the step of implanting a dopant in the first element region with the first resist film and the gate electrodes as a mask to form a first dopant diffused region; the first ashing processing step of ashing the first resist film; the first chemical processing step of removing the first resist film with a chemical liquid; the step of forming a sidewall insulation film over the side wall of the gate electrode; the step of forming a second resist film over the semiconductor substrate, the gate electrode and the sidewall insulation film, the second resist film being opened in the first element region; the step of implanting a dopant in the first element region with the second resist film, the gate electrode and the sidewall insulation film as a mask to form a second dopant diffused region; the second ashing processing step of ashing the second resist film; and the second chemical processing step of removing the second resist film with a chemical liquid, a chemical liquid processing period of time in the first chemical liquid processing step being shorter than a chemical liquid processing period of time in the second chemical liquid processing step.

According to further another aspect of the present invention, there is provided a method for fabricating a semiconductor device comprising: the step of forming a gate electrode over a semiconductor substrate with a gate insulation film formed therebetween; the step of implanting a dopant in the semiconductor substrate with the gate electrode with a mask to form a first dopant diffused region in the semiconductor substrate on both sides of the gate electrode; the first cleaning processing step of cleaning the substrate with a chemical liquid; the first thermal processing step of performing thermal processing to activate the dopant in the first dopant in the first dopant diffused region; the step of forming a sidewall insulation film over the side wall of the gate electrode; the step of implanting a second dopant in the semiconductor substrate with the gate electrode and the sidewall insulation film as a mask to form a second dopant diffused region; the second cleaning processing step of cleaning the semiconductor substrate with a chemical liquid; and the second thermal processing step of performing thermal processing for activating the second dopant in the second dopant diffused region, a cleaning processing period of time in the first cleaning processing step being shorter than a cleaning processing period of time in the second cleaning processing step.

As described above, according to the present invention, the ashing processing period of time for removing the first photoresist film used in forming the extension region is set shorter than the ashing processing period of time for removing the second photoresist film used in the deep dopant diffused region, whereby the extension region is prevented from being largely oxidized when the first photoresist film is removed. On the other hand, when the second photoresist film is removed, the ashing processing period of time is set longer so that the second photoresist film can be removed without failure. At the time of removing the second photoresist film, part of the extension region near the gate electrode is covered with the sidewall insulation film, whereby the parts of the extension region near the gate electrode is kept form being largely oxidized. Thus, according to the present invention, the electric resistance of the extension region can be low, and semiconductor devices of good electric characteristics can be provided.

According to the present invention, when the first photoresist film used in forming the extension region is removed, the first photoresist film is ashed by using $O_2$ gas alone, and when the second photoresist film used in forming the deep diffused region is removed, the second photoresist film is ashed by using a mixed gas. Since the first photoresist film is ashed by using the $O_2$ gas alone, the extension region can be prevented from being largely oxidized. On the other hand, when the second photoresist film is removed, a mixed gas which can remove the second photoresist film without failure is used to ash the second photoresist film. At the time of removing the second photoresist film, part of the extension region near the gate electrode is covered with the sidewall insulation film, whereby the parts of the extension region near the gate electrode is kept form being largely oxidized. Thus, according to the present invention, the electric resistance of the extension region can be low, and semiconductor devices of good electric characteristics can be provided.

According to the present invention, the period of time for the chemical liquid processing using APM liquid for removing the first photoresist film is set shorter than the period of time of the chemical liquid processing with APM liquid for removing the second photoresist film, whereby the extension region is prevented from being largely removed when the first photoresist film is removed. On the other hand, when the second photoresist film is removed, the chemical liquid processing with APM liquid is performed for a sufficient period of time so that the second photoresist film can be removed without failure. At the time of removing the second photoresist film, part of the extension region near the gate electrode is covered with the sidewall insulation film, whereby the parts of the extension region near the gate electrode is prevented from being largely etched. Thus, according to the present invention, the electric resistance of the extension region can be low, and semiconductor devices of good electric characteristics can be provided.

According to the present invention, the period of time for the first cleaning processing performed before the thermal processing for activation the dopant in the extension region is set shorter than the period of time for the second cleaning processing with APM liquid performed before the thermal processing for activating the dopant in the deep dopant diffused region, whereby the extension region is prevented from being largely etched in the first cleaning processing. On the other hand, in the second cleaning processing, the period of time for the cleaning processing with APM liquid is set longer so that particles and organic impurities can be removed without failure. At the time of the second cleaning processing, part of the extension region near the gate electrode is covered with the sidewall insulation film, whereby the parts of the extension region near the gate electrode is prevented form being largely oxidized. Thus, according to the present invention, the electric resistance of the extension region can be low, and semiconductor devices of good electric characteristics can be provided.

DETAILED DESCRIPTION OF THE INVENTION

The semiconductor device fabrication method according to one embodiment of the present invention will be explained with reference to FIGS. 1A to 15. FIGS. 1A to 7 are sectional views of a semiconductor device in the steps of the semiconductor device fabrication method according to the present embodiment.

Figure 1A:
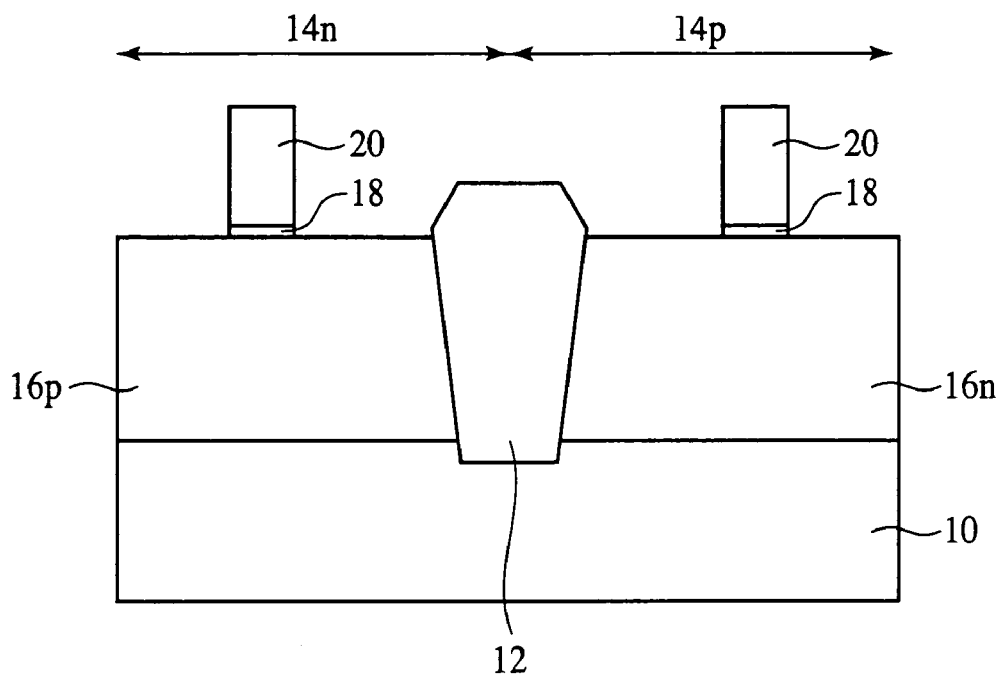
FIGS. 1A and 1B are sectional views of a semiconductor device in the steps of the semiconductor device fabrication method according to one embodiment of the present invention, which show the method (Part 1).

First, as shown in FIG. 1A, an element isolation region 12 defining element regions are formed on a semiconductor substrate 10 of, e.g., silicon. The element isolation region 12 is formed by, e.g., STI (Shallow Trench Isolation).

Then, a photoresist film (not shown) is formed on the entire surface by, e.g., spin coating.

Then, an opening (not shown) for opening a region 14n for an NMOS transistor to be formed in is formed in the photoresist film by photolithography.

Next, with the photoresist film as the mask, a p-type dopant is implanted to form a p-type well 16p in the semiconductor substrate 10 in the region 14n for the NMOS transistor to be formed in.

Then, the photoresist film is removed, i.e., released.

Then, a photoresist film (not shown) is formed on the entire surface by, e.g., spin coating.

Then, an opening (not shown) for opening a region 14p for a PMOS transistor to be formed in is formed in the photoresist film by photolithography.

Next, with the photoresist film as the mask, an n-type dopant is implanted to form an n-type well 16n in the semiconductor substrate 10 in the region 14p for the PMOS transistor to be formed in.

Then, the photoresist film is removed.

Next, a 1.1 nm-thickness gate insulation film 18 is formed on the entire surface. The gate insulation film 18 is formed by, e.g., thermal oxidation.

Next, a 100 nm-thickness polysilicon film is formed on the entire surface. Then, the polysilicon film is patterned into a gate electrode configuration by photolithography. For the patterning, anisotropic etching, for example is used. Thus, the gate electrode 20 of the polysilicon is formed.

Figure 1B:
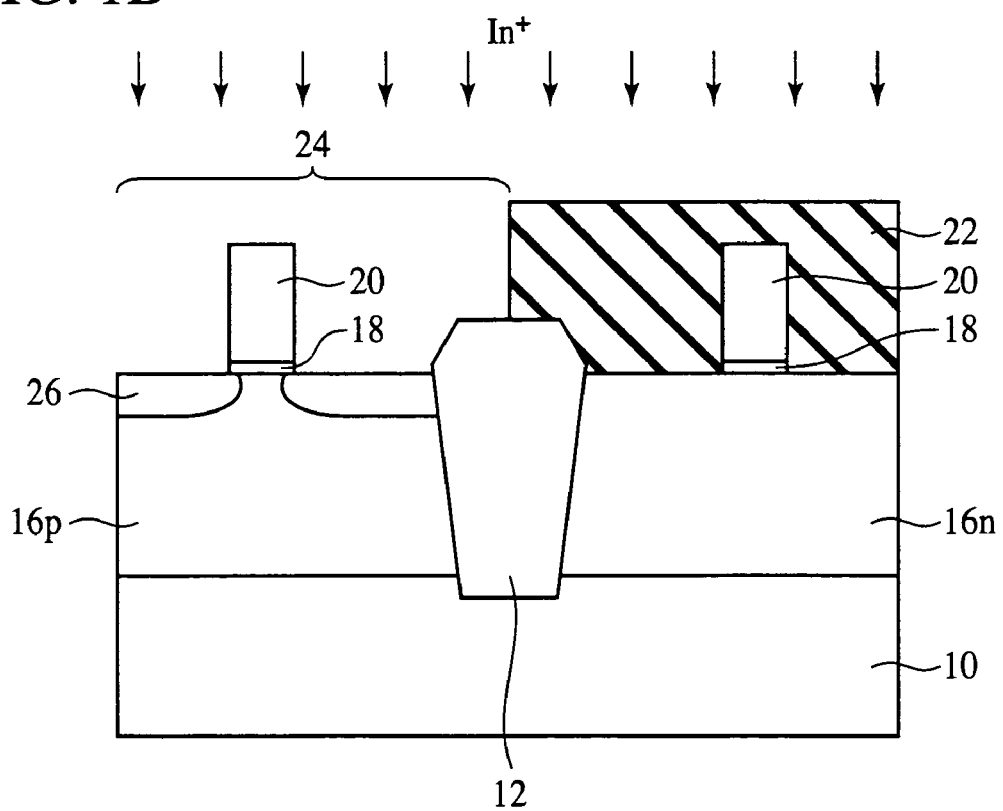

Next, as shown in FIG. 1B, a photoresist film 22 is formed on the entire surface by, e.g., spin coating.

Next, an opening 24 for opening a region 14n for the NMOS transistor to be formed in is opened in the photoresist film 22 by photolithography.

Next, a p-type dopant is implanted in the semiconductor substrate 10 on both sides of the gate electrode 20 by, e.g., ion implantation with the photoresist film 24 and the gate electrode 20 as the mask. The p-type dopant is, e.g., indium (In). Conditions for the ion implantation are, e.g., a 150 keV acceleration energy and a $5 \times 10^{13}$ cm$^{-2}$ dose. Thus, p-type pocket regions 26 are formed in the semiconductor substrate 10 on both sides of the gate electrode 20.

Here, the p-type dopant is indium but is not limited to indium. The p-type dopant can be, e.g., boron.

Figure 2A:
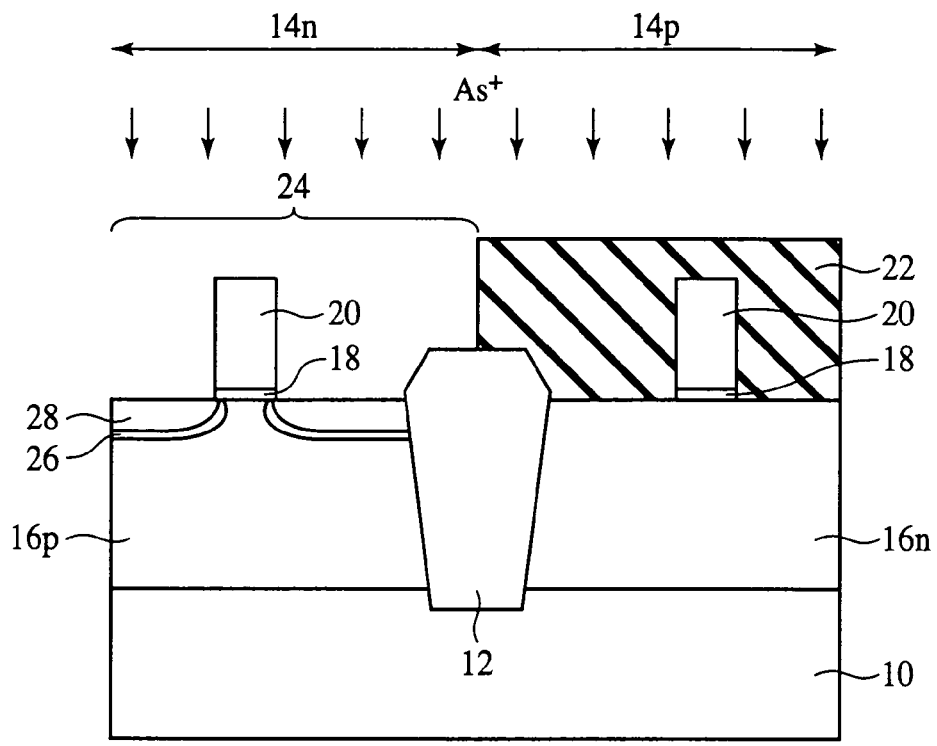
FIGS. 2A and 2B are sectional views of a semiconductor device in the steps of the semiconductor device fabrication method according to the embodiment of the present invention, which show the method (Part 2).

Then, as shown in FIG. 2A, an n-type dopant is implanted in the semiconductor substrate 10 on both sides of the gate electrode 20 by, e.g., ion implantation with the photoresist film 22 and the gate electrode 20 as the mask. The n-type dopant can be, e.g., arsenic (As), phosphorus (P) or antimony (Sb). Conditions for the ion implantation are, e.g., a 5 keV acceleration energy and an about $1 \times 10^{15}$ cm$^{-2}$ dose.

Thus, the dopant diffused regions 28 forming the shallow regions of the extension source/drain structure are formed in the semiconductor substrate 10 on both sides of the gate electrode 20, i.e., the extension region is formed.

Next, the photoresist film 22 is removed, i.e., released. When the photoresist film is removed, first the photoresist film is subjected to ashing processing and then is subjected to chemical processing using a chemical liquid, i.e., wet processing.

First, the ashing of the photoresist film 22 will be explained.

For ashing the photoresist film 22, a mixed gas of $O_2$ gas, $CF_4$ gas and a foaming gas is used. The $CF_4$ gas is for accelerating the release of the photoresist film. The foaming gas is for preventing the residual of the photoresist film. The foaming gas is, e.g., a mixed gas of $N_2$ gas and $H_2$ gas or a mixed gas of $N_2$ gas and He gas. Most of the foaming gas is $N_2$ gas, and the rest several percentage of the foaming gas is $H_2$ gas or He gas.

The ashing period of time for the photoresist film 22 is set to be shorter than that for the photoresist film 44, 52 (refer to FIG. 5A and FIG. 5B) in later steps. Specifically, the ashing processing period of time for the photoresist film 22 is below 0.7 times the ashing processing period of time for the photoresist films 44, 52 in the later steps. Furthermore, the ashing processing period of time for the photoresist film 22 is below 0.5 times the ashing processing period of time for the photoresist films 44, 52 in the later steps. Setting the ashing processing period of time for the photoresist film 22 to be short can prevent excessive oxidation of the surface of the semiconductor substrate 10 on both sides of the gate electrode 20. However, when the ashing processing period of time for the photoresist film 22 is too short, there is a risk that the photoresist film 22 could not be removed. Preferably, the ashing period of time is set suitably for the photoresist film 22 to be removed. When a mixed gas of $O_2$ gas, $CF_4$ gas and a foaming gas is used for the ashing processing for the photoresist film 22, the ashing processing period of time for the photoresist film 22 is, e.g., 60 seconds.

The mixed gas of $O_2$ gas, $CF_4$ gas and the foaming gas is used here for the ashing processing for the photoresist film 22, but $O_2$ gas alone is used as the reactive gas to ash the photoresist film 22. When $O_2$ gas alone is used as the reaction gas for the ashing processing for the photoresist film 22, there is a tendency that the oxidized amount of the semiconductor substrate 10 is small. Accordingly, when $O_2$ gas alone is used as the reaction gas for the ashing processing for the photoresist film 22, the ashing processing period of time may not be made too short. When $O_2$ gas alone is used as the reaction gas for the ashing processing for the photoresist film 22, the ashing processing period of time is, e.g., 180 seconds.

Then, the chemical liquid processing for removing the ashed photoresist film 22 with chemical liquids will be explained.

In the chemical liquid processing, first the photoresist film 22 is removed with SPM liquid (Sulfuric acid-Hydrogen Peroxide Mixture), and the residue of the photoresist film 22 which has not be removed by the SPM liquid is removed with APM (Ammonia-Hydrogen Peroxide Mixture) liquid. SPM liquid is a chemical liquid mixing sulfuric acid and hydrogen peroxide. APM liquid is a chemical liquid mixing ammonia, hydrogen peroxide and water.

First, the chemical liquid processing with SPM will be explained.

The mixing ratio of the sulfuric acid and hydrogen peroxide of the SPM liquid is, e.g., 4:1. The chemical liquid processing period of time for the SPM liquid is, e.g., 20 minutes.

Next, the chemical liquid processing with the APM liquid will be explained.

The mixing ratio of ammonia, hydrogen peroxide and water of the APM liquid is, e.g., 1:1:5.

The mixing ratio of ammonia, hydrogen peroxide and water of the APM liquid is not essentially 1:1:5 and can be suitably set.

The chemical liquid processing period of time for removing the photoresist film 22 with APM liquid is set to be shorter than the chemical liquid processing period of time for the photoresist films 44, 52 (refer to FIGS. 5A and 5B) with APM liquid in later steps. Specifically, the chemical liquid processing period of time for removing the photoresist film 22 with APM liquid is set to be below 0.7 times that for the photoresist films 44, 52 with APM liquid in the later steps. Furthermore, the APM liquid chemical liquid processing period of time for the photoresist film 22 is set to be below 0.5 times that for removing the photoresist films 44, 52 with APM liquid in the later steps. The APM liquid chemical liquid processing period of time is here, e.g., 300 seconds. Setting short the chemical liquid processing period of time for removing the photoresist film 22 with APM liquid can prevent the surface of the semiconductor substrate 10 on both sides of the gate electrode 10 from largely etched with APM liquid. However, too short chemical liquid processing period of time for removing the photoresist film 22 with APM liquid causes a risk that the photoresist film 22 may reside. Preferably, the APM liquid chemical liquid processing period of time is set suitably for the residual of the photoresist film 22 to be removed.

Thus, the photoresist film 22 is removed.

Figure 2B:
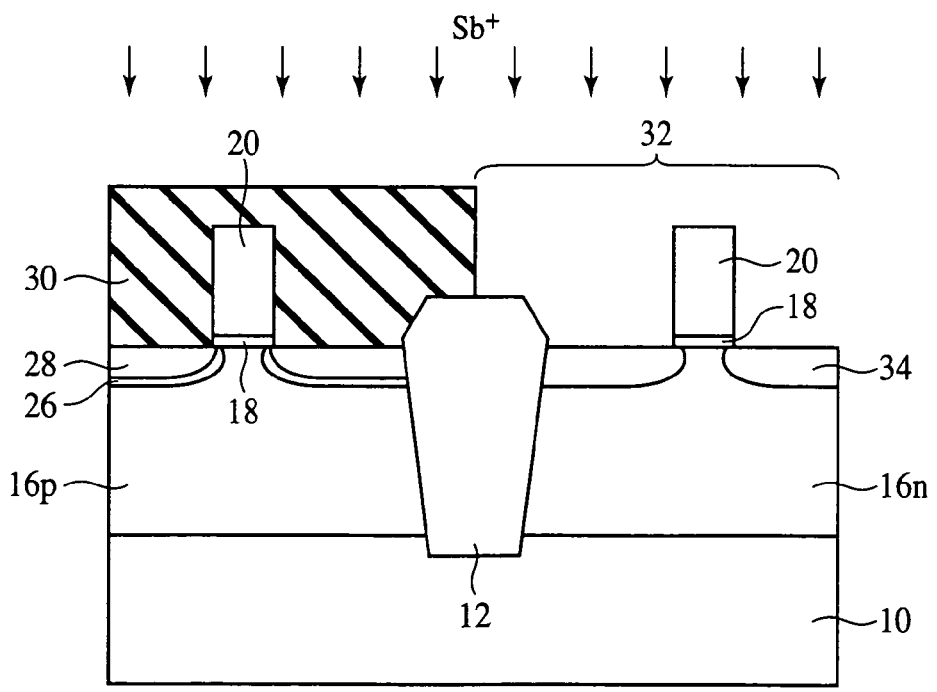

Next, as shown in FIG. 2B, a photoresist film 30 is formed on the entire surface by, e.g., spin coating.

Then, an opening 32 for opening the region 14p for the PMOS transistor to be formed in is formed in the photoresist film 30 by photolithography.

Next, with the photoresist film 30 and the gate electrode 20 as the mask, an n-type dopant is implanted in the semiconductor substrate 10 on both sides of the gate electrode 20 by, e.g., ion implantation. Then-type dopant can be, e.g., antimony (Sb). Conditions for the ion implantation are, e.g., a below 150 keV acceleration energy and an about $5 \times 10^{13}$ $cm^{-2}$ dose. Thus, n-type pockets regions 34 are formed in the semiconductor substrate 10 on both sides of the gate electrode 20.

Figure 3A:
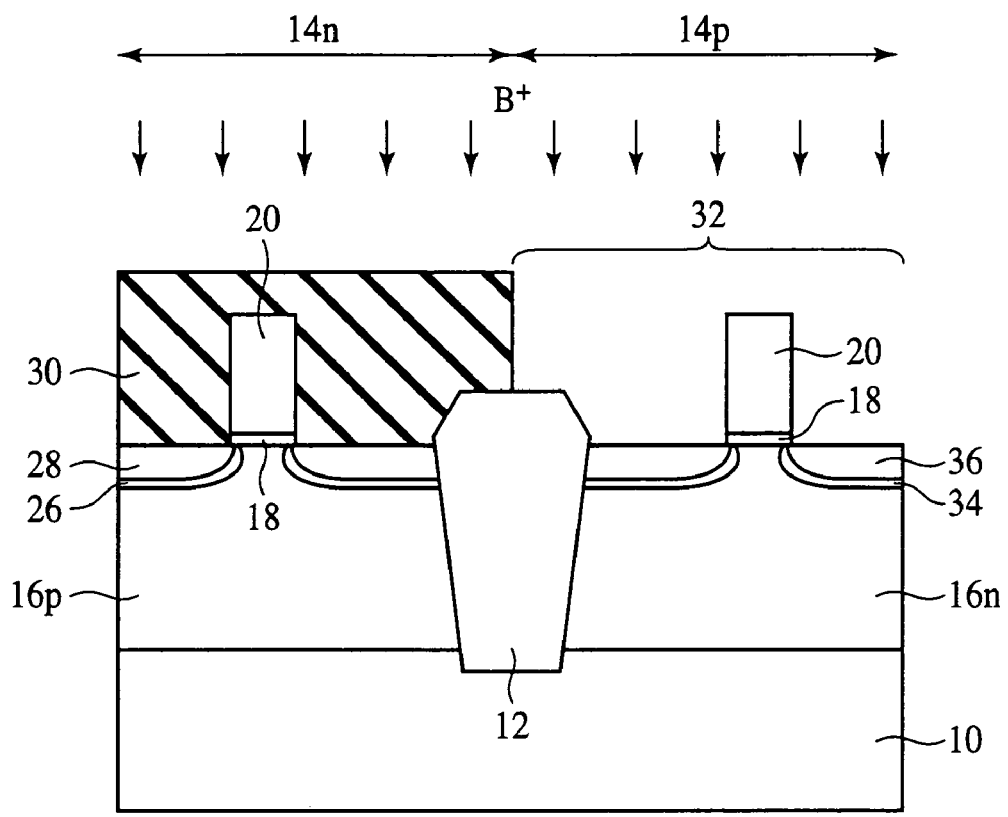
FIGS. 3A and 3B are sectional views of a semiconductor device in the steps of the semiconductor device fabrication method according to the embodiment of the present invention, which show the method (Part 3).

Next, as shown in FIG. 3A, with the photoresist film 30 and the gate electrode 20 as the mask, ap-type dopant is implanted in the semiconductor substrate 10 on both sides of the gate electrode 20 by, e.g., ion implantation. The p-type dopant can be, e.g., boron (B). Conditions for the ion implantation are, e.g., a 1 keV acceleration energy and an about $1 \times 10^{15}$ $cm^{-2}$ dose. Thus, dopant diffused regions 36 forming the shallow regions of the extension source/drain structure, i.e., the extension region is formed in the semiconductor substrate 10 on both sides of the gate electrode 20.

Next, the photoresist film 30 is removed. The photoresist film 30 can be removed in the same way as in the semiconductor device fabrication method described above with reference to FIG. 2A. That is, the ashing processing period of time for ashing the photoresist film 30 is set short, and the chemical processing period of time for removing the photoresist film 30 with APM liquid is set short.

Figure 3B:
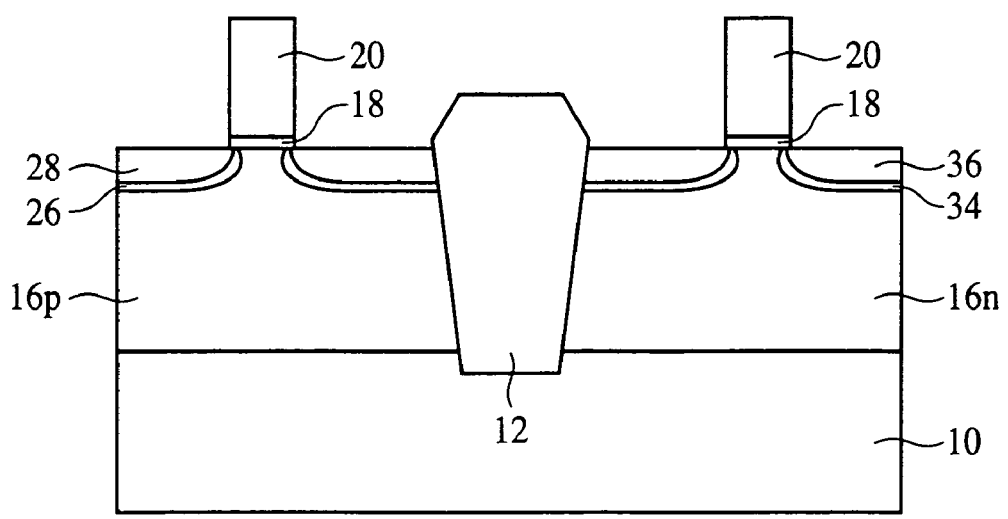

Thus, the photoresist film 30 is removed (refer to FIG. 3B).

Next, as a pre-treatment for thermal processing for activating the dopants in the extension regions 28, 36, cleaning processing for cleaning the surface of the semiconductor substrate 10 is performed.

In the cleaning processing, the cleaning processing with APM liquid and the cleaning processing with HPM (Hydrochloric acid-Hydrogen Peroxide Mixture) liquid are performed. HPM liquid is a chemical liquid mixing hydrochloric acid, hydrogen peroxide and water. APM liquid is used mainly to remove particles and organic impurities adhering to the surface of the semiconductor substrate 10. HPM liquid is used to remove traces of metals present on the surface of the semiconductor substrate 10.

First, the cleaning processing with APM liquid will be explained.

The mixing ratio of ammonia, hydrogen peroxide and water of the APM liquid is, e.g., 1:1:5.

The mixing ratio of ammonia, hydrogen peroxide and water of the APM liquid is not essentially 1:1:5 and can be suitably set.

In the pre-treatment for the thermal processing for activating the dopants in the extension regions 28, 36, the APM liquid cleaning processing period of time is set short. Specifically, the cleaning processing period of time of the pre-treatment with APM liquid for the thermal processing for the extension regions 28, 36 are set to be below 0.7 times that of a pre-treatment for thermal processing for deep dopant diffused regions 48, 56 (refer to FIGS. 5A and 5B) in later steps. Furthermore, the cleaning processing period of time of the pre-treatment with APM liquid for the thermal processing for the extension regions 28, 36 is set to be below 0.5 times that of the pre-treatment with APM liquid for the thermal processing for the deep dopant diffused regions 48, 56 in the later steps. The APM liquid cleaning processing period of time is, e.g., 300 seconds. Setting short the cleaning processing period of time for the pre-treatment with APM liquid for the thermal processing for activating the dopants in the extension regions 28, 36 can prevent the extension regions 28, 36 on both sides of the gate electrode 20 from being largely etched. However, too short APM liquid cleaning processing period of time causes a risk that particles and organic impurities could not be removed. The APM cleaning processing period of time is set suitably for the particles and organic impurities to be removed.

Next, the cleaning processing with HPM liquid will be explained.

The mixing ratio of hydrochloric acid, hydrogen peroxide and water of the HPM is, e.g., 1:1:5. The HPM cleaning processing period of time is, e.g., 600 seconds.

Thus, the surface of the semiconductor substrate 10 is cleaned.

Next, the thermal processing for activating the dopants in the extension regions 28, 36 is performed by, e.g., RTA (Rapid Thermal Annealing). The thermal processing temperature is, e.g., 800–1100° C. The thermal processing period of time is, e.g., below dozens of seconds.

Figure 4A:
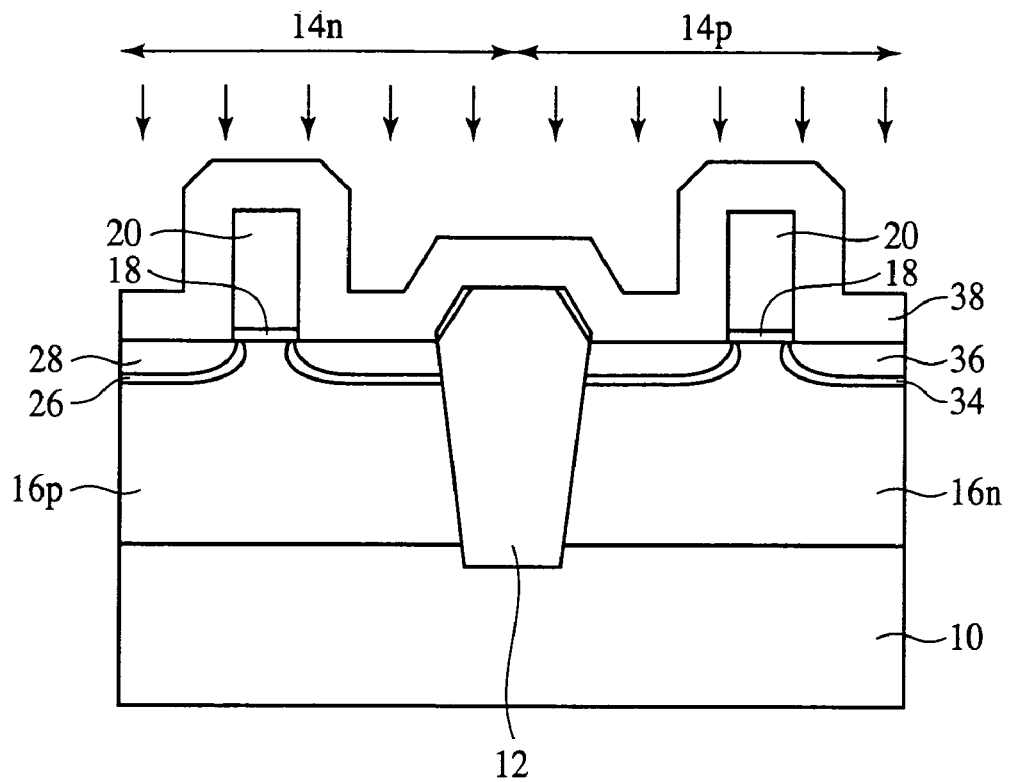
FIGS. 4A and 4B are sectional views of a semiconductor device in the steps of the semiconductor device fabrication method according to the embodiment of the present invention, which show the method (Part 4).

Next, as shown in FIG. 4A, a 100 nm-thickness silicon oxide film 38 is formed on the entire surface by, e.g., low pressure thermal CVD.

Figure 4B:
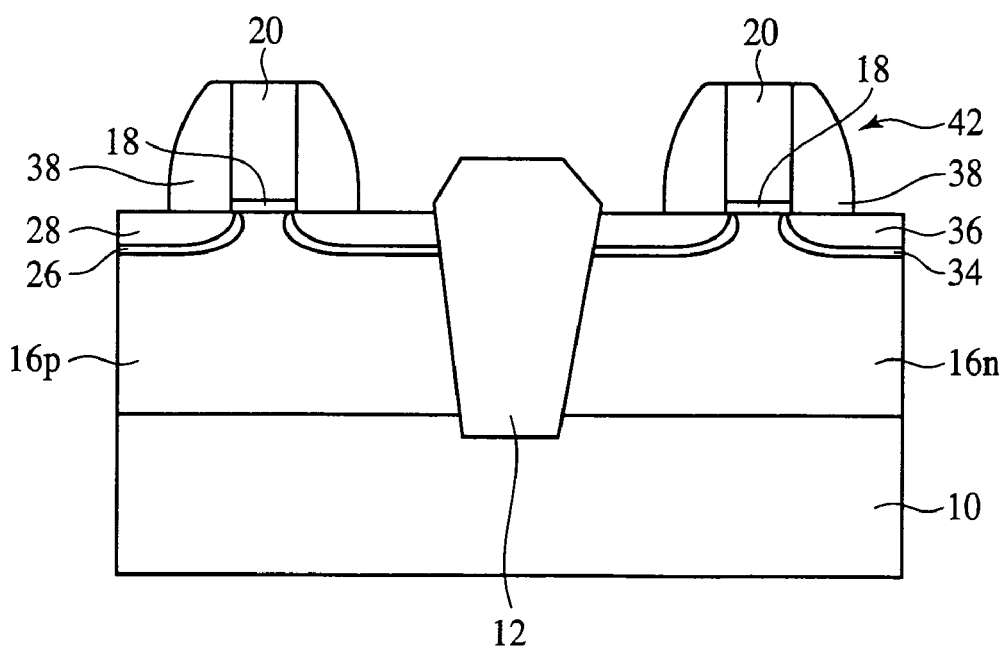

Then, as shown in FIG. 4B, the silicon oxide film 38 is anisotropically etched. The etching gas is, e.g., hydrofluorocarbon. Thus, a sidewall insulation film 42 of the layer structure of the silicon oxide film 38 is formed on the side wall of the gate electrode 20.

Figure 5A:
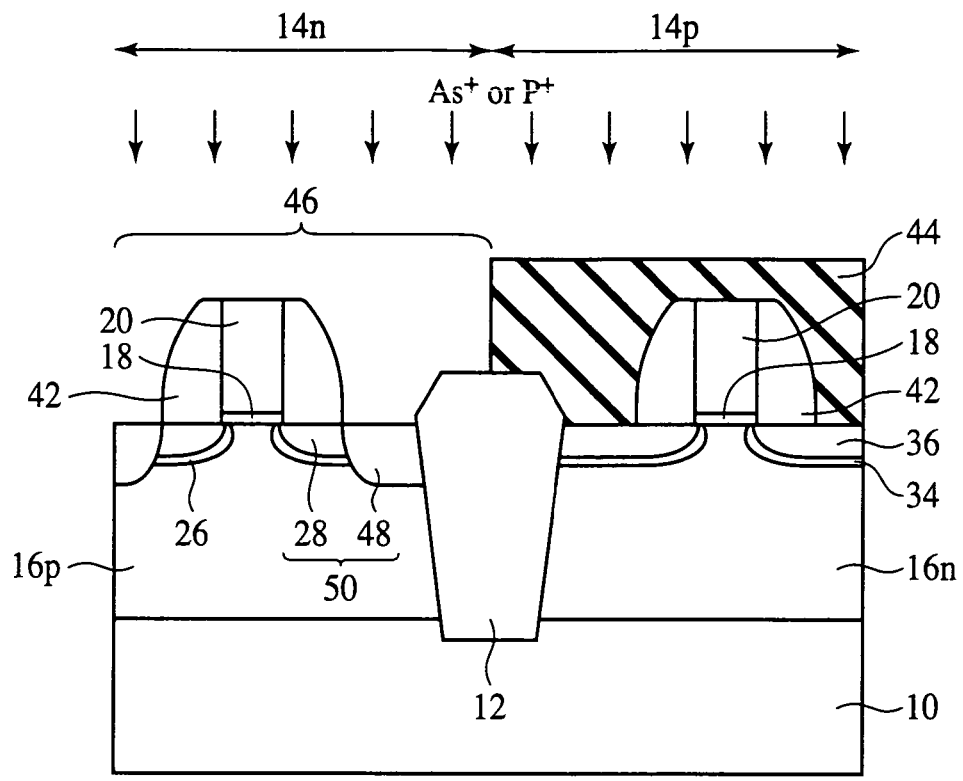
FIGS. 5A and 5B are sectional views of a semiconductor device in the steps of the semiconductor device fabrication method according to the embodiment of the present invention, which show the method (Part 5).

Then, as shown in FIG. 5A, a photoresist film 44 is formed on the entire surface by, e.g., spin coating.

Next, an opening 46 for opening the region 14n for the NMOS transistor to be formed in is opened in the photoresist film 44 by photolithography.

Then, with the photoresist film 44, the gate electrode 20 and the sidewall insulation film 42 as the mask, an n-type dopant is implanted in the semiconductor substrate 10 by, e.g., ion implantation. The n-type dopant can be, e.g., arsenic (As) or phosphorus (P). Conditions for the ion implantation are, e.g., a below 40 keV acceleration energy and a below $1 \times 10^{16}$ cm$^{-2}$ dose.

Thus, n-type dopant diffused regions 48 of the deep regions of the extension source/drain structure are formed in the semiconductor substrate 10 on both sides of the gate electrode 20 with the sidewall insulation film 42 formed on the side wall. The deep dopant diffused regions 48 are formed in a higher carrier concentration than the extension region 28. The extension region 28, i.e., the shallow dopant diffused regions, and the deep dopant diffused regions 48 form the source/drain diffused layer 50 of the extension source/drain structure.

Next, the photoresist film 44 is removed. When the photoresist film 44 is removed, first ashing processing for ashing the photoresist film 44 is performed, and then chemical processing for removing the ashed photoresist film 44 with chemical liquids.

First, the ashing processing for the photoresist film 44 will be explained.

For the ashing processing for the photoresist film 44, a mixed gas mixing, $O_2$ gas, $CF_4$ gas and a foaming gas is used. The ashing processing period of time for the photoresist film 44 is, e.g., 180 seconds. The ashing processing period of time for the photoresist film 44 is set longer than that for the photoresist films 22, 30 so as to allow a sufficient time margin for removing the photoresist film 44. At the time of ashing the photoresist film 44, parts of the extension regions 28, 36 near the gate electrode are covered with the sidewall insulation film 42, and the parts of the extension regions 28, 36 near the gate electrode 20 are not oxidized, without any problem.

Then, the ashed photoresist film 44 is removed by the chemical processing with chemical liquids. In the chemical liquid processing, the photoresist film 44 is removed first with SPM liquid, and residue of the photoresist film 44 is removed with APM liquid.

First, the chemical liquid processing with SPM will be explained.

The mixing ratio of sulfuric acid and hydrogen peroxide of the SPM liquid is, e.g., 4:1. The SPM liquid chemical liquid processing period of time is, e.g., 20 minutes.

Next, the chemical processing with APM liquid will be explained.

The mixing ratio of ammonia, hydrogen peroxide and water of the APM liquid is, e.g., 1:1:5. The APM liquid chemical liquid processing period of time is, e.g., 600 seconds. The chemical liquid processing period of time for removing the photoresist film 44 with APM liquid is set longer than that for removing the photoresist films 22, 30 with APM liquid so as to allow a sufficient time margin for removing the photoresist film 44. At the time of making the chemical liquid processing on the photoresist film 44 with APM liquid, parts of the extension regions 28, 36 near the gate electrode 20 are covered with the sidewall insulation film 42, and the parts of the extension regions 28, 36 near the gate electrode 20 are kept from large etching with the APM liquid, without any problem.

Thus, the photoresist film 44 is removed.

Figure 5B:
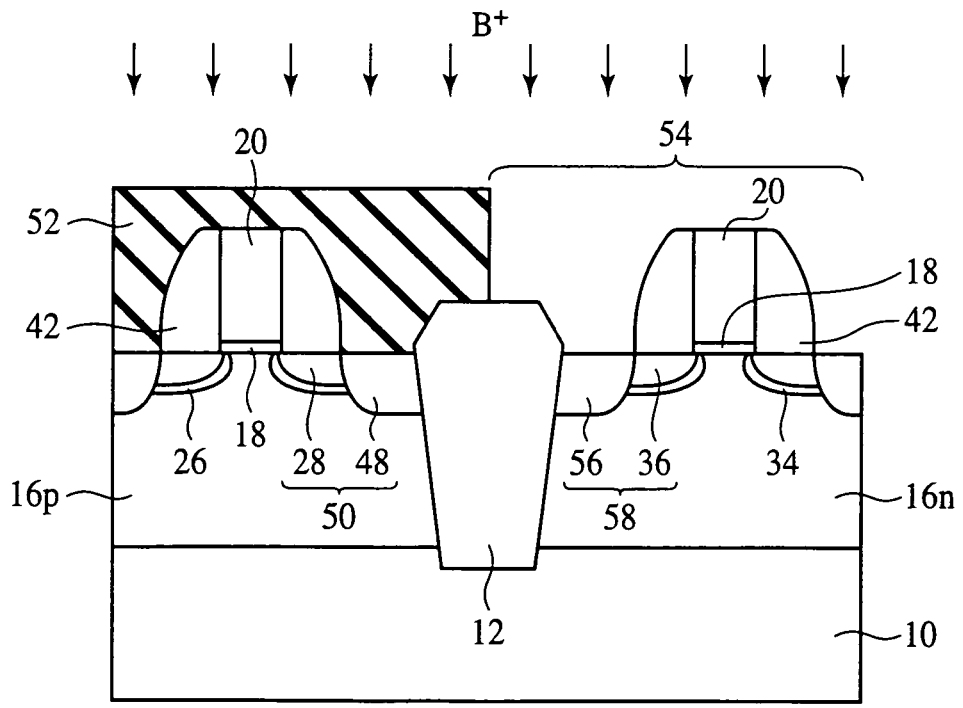

Next, a shown in FIG. 5B, a photoresist film 52 is formed on the entire surface by, e.g., spin coating.

Next, an opening 54 for opening the region 14p for the PMOS transistor to be formed in is opened in the photoresist film 52 by photolithography.

Next, with the photoresist film 52, the gate electrode 20 and the sidewall insulation film 42 as the mask, a p-type dopant is implanted into the semiconductor substrate 20. The p-type dopant can be, e.g., boron. Conditions for the ion implantation are, e.g., a below 7 keV acceleration energy and a below $1 \times 10^{16}$ cm$^{-2}$ dose.

Thus, p-type dopant diffused regions 56 forming the deep region of the extension source/drain structure are formed in the semiconductor substrate 10 on both sides of the gate electrode 20 with the sidewall insulation film 42 formed on the side wall. The deep dopant diffused region 56 are formed in a higher carrier concentration than the extension region 36. The extension region 36, i.e., the shallow dopant-diffused regions, and the deep dopant diffused regions 56 form the source/drain diffused layer 58 of the extension source/drain structure.

Next, the photoresist film 52 is removed. The photoresist film 52 is removed in the same way as in the semiconductor device fabrication method described above with reference to FIG. 5A. That is, the ashing processing period of time for ashing the photoresist film 52 is set long sufficiently to remove the photoresist film 52 with APM liquid.

Figure 6A:
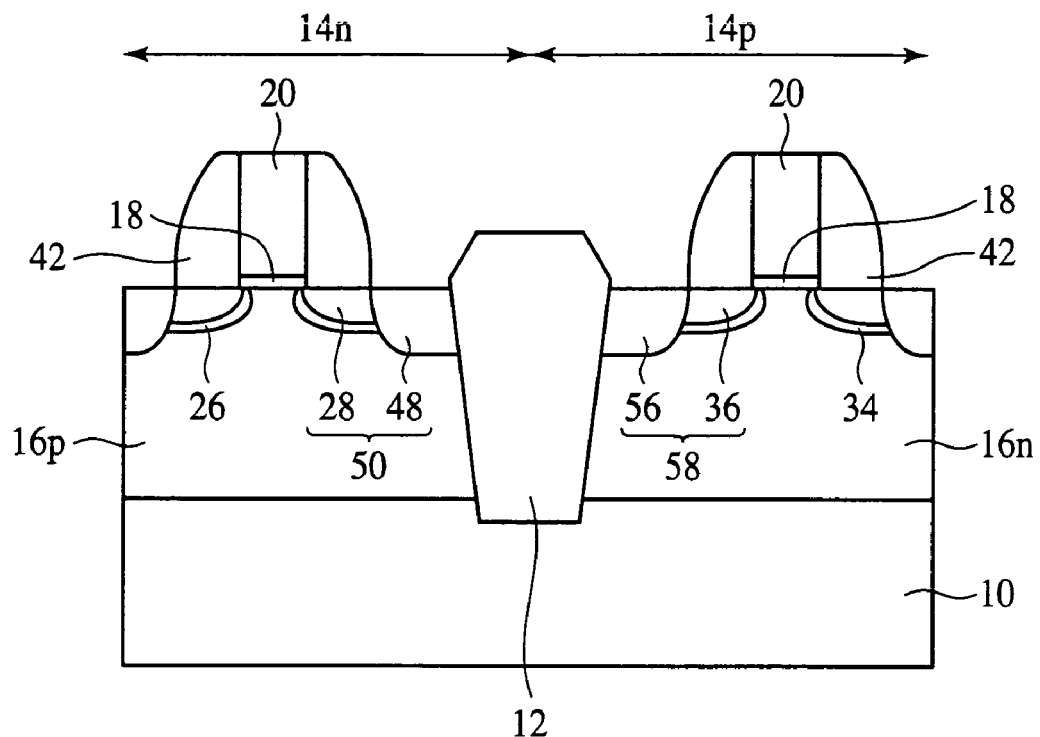
FIGS. 6A and 6B are sectional views of a semiconductor device in the steps of the semiconductor device fabrication method according to the embodiment of the present invention, which show the method (Part 6).

Thus, the photoresist film 52 is removed (refer to FIG. 6A).

Next, as a pre-treatment for the thermal processing for activating the dopants in the deep dopant diffused regions 48, 56, cleaning processing for cleaning the surface of the semiconductor substrate 10 is performed.

In the cleaning processing, cleaning processing with APM liquid, and cleaning processing with HPM liquid are performed.

First, the chemical liquid processing with APM will be explained.

The mixing ratio of ammonia, hydrogen peroxide and water of the APM liquid is, e.g., 1:1:5. The mixing ratio of ammonia, hydrogen peroxide and water of the APM liquid is not essentially 1:1:5 and can be suitably set. The APM cleaning processing period of time is, e.g., 600 seconds. The APM cleaning processing period of time is set long so as to allow a sufficient time margin for removing particles and organic impurities. At the time of making the chemical liquid processing with APM liquid, parts of the extension regions 28, 36 near the gate electrode 20 are covered with the sidewall insulation film 42, and the parts of the extension regions 28, 36 near the gate electrode 20 are prevent from large etching with the APM liquid, without any problem.

Next, the cleaning processing with HPM liquid will be explained.

The mixing ratio of hydrochloric acid, hydrogen peroxide and water of the HPM liquid is, e.g., 1:1:5. The HPM liquid cleaning processing period of time is, e.g. 600 seconds.

Thus, the surface of the semiconductor substrate 10 is cleaned.

The cleaning processing with HPM liquid here follows the cleaning processing with APM liquid, but the cleaning processing with APM liquid may be followed the cleaning processing with HPM liquid.

Next, thermal processing for activating the dopants in the deep dopant diffused regions 48, 56 is performed. The heat processing temperature is, e.g., 800–1100° C. The thermal processing period of time is, e.g., below dozens of seconds.

Figure 6B:
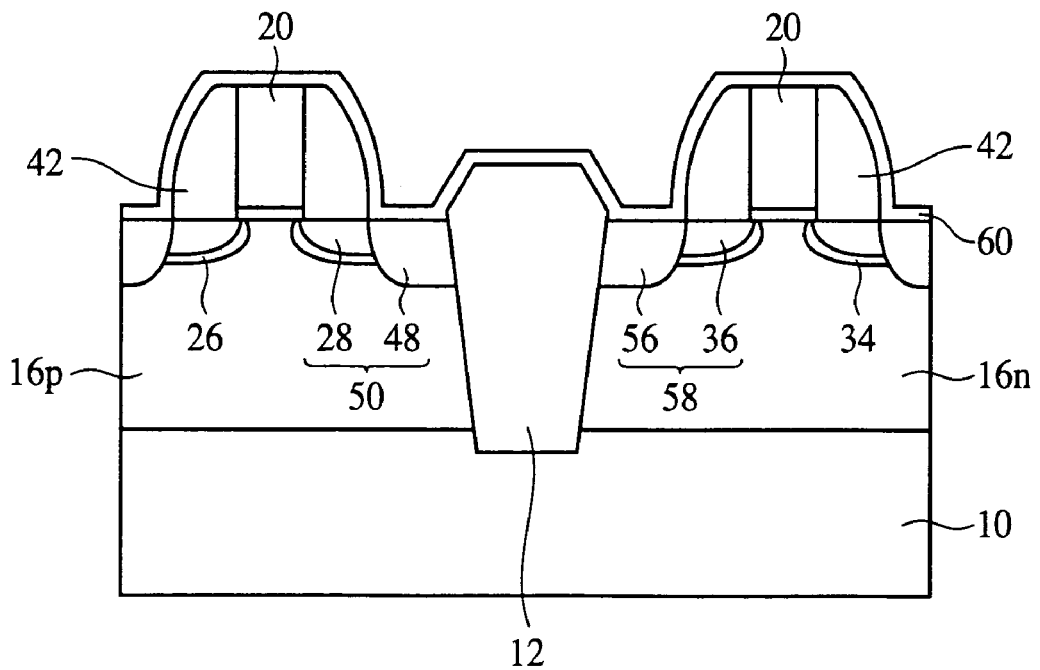
Figure 7:
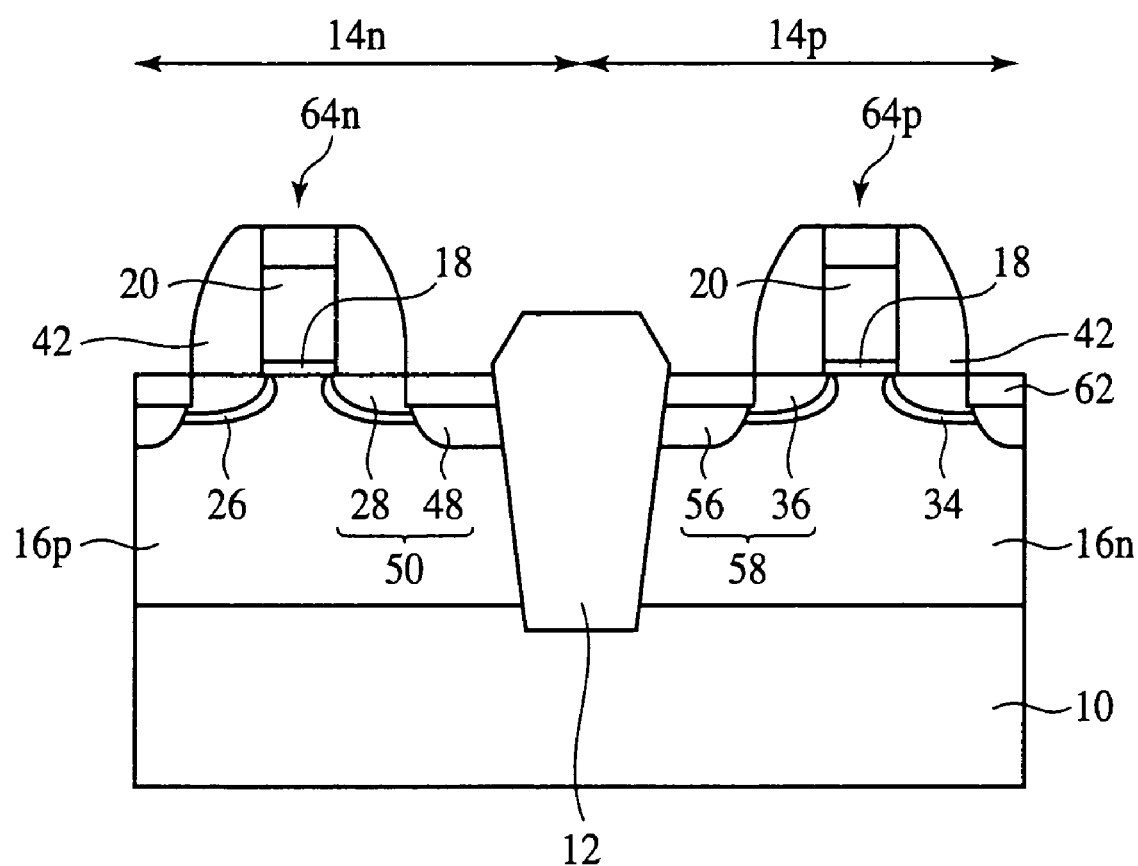
FIG. 7 is sectional views of a semiconductor device in the steps of the semiconductor device fabrication method according to the embodiment of the present invention, which show the method (Part 7).

Next, as shown in FIG. 6B, a metal film 60 of, e.g., cobalt (Co) is formed on the entire surface by, e.g., sputtering. The film thickness of the metal film 60 is, e.g., about 5 nm.

Then, the cobalt of the metal film 60 and the silicon of the semiconductor substrate 10 are reacted with each other by thermal processing. Thus, a cobalt silicide film, for example, is thus formed. Then, the metal film 60 which has not reacted with the silicon is removed. Thus, source/drain electrodes 62 of cobalt silicide are formed (refer to FIG. 7).

Thus, the semiconductor device fabrication method according to the present embodiment fabricate a semiconductor device including an NMOS transistor 64n and a PMOS transistor 64p.

The semiconductor device fabrication method according to the present embodiment is characterized mainly in that the ashing processing period of time for removing the photoresist films 22, 30 is set shorter than that for removing the photoresist films 44, 52.

In the proposed semiconductor fabrication method, all the photoresist films are removed by ashing under the same conditions. Accordingly, the extension region is largely oxidized and has high electric resistance.

In contrast to this, in the semiconductor device fabrication method according to the present embodiment, the ashing processing period of time for removing the photoresist films 22, 30 is set shorter than that for removing the photoresist films 44, 52. Accordingly, when the photoresist films 22, 30 are removed, the extension regions 28, 36 can be prevent from being largely oxidized. The ashing processing period of time for removing the photoresist films 44, 52 is set longer so that the photoresist films 44, 52 can be removed without failure. At the time of removing the photoresist films 44, 52, parts of the extension regions 28, 36 near the gate electrode 20 are covered with the sidewall insulation film 42, whereby the parts of the extension regions 28, 36 near the gate electrode 20 are prevent from being largely oxidized, without any problem. Thus, according to the present embodiment, the electric resistance of the extension regions 28, 36 can be suppressed to be low, and can provide semiconductor devices of good electric characteristics.

The semiconductor device fabrication method according to the present embodiment is also characterized mainly in that the APM liquid chemical liquid processing period of time for removing the photoresist films 22, 30 is set shorter than that for removing the photoresist films 44, 52.

In the proposed semiconductor device fabrication method, all the photoresist films are removed by the chemical processing with APM liquid under the same conditions. Accordingly, the extension region is largely etched with the APM liquid, and the electric resistance of the extension region is high.

In contrast to this, in the semiconductor device fabrication method according to the present embodiment, the APM liquid chemical liquid processing period of time for removing the photoresist films 22, 30 is set shorter than that for removing the photoresist films 44, 52. Accordingly when the photoresist films 22, 30 are removed, the extension regions 28, 36 can be kept from being largely etched. On the other hand, when the photoresist films 44, 52 are removed, the chemical liquid processing with APM liquid is performed for a sufficient period of time for removing the photoresist films 44, 52 without failure. At the time of removing the photoresist films 44, 52, parts of the extension regions 28, 36 near the gate electrode 20 are covered with the sidewall insulation film 42, whereby the parts of the extension regions 28, 36 are prevented from being largely etched, without any problem. Thus, according to the present embodiment, the electric resistance of the extension regions 28, 36 can be low, and semiconductor devices having good electric characteristics can be provided.

The semiconductor device fabrication method according to the present embodiment is also characterized mainly in that the period of time for the cleaning processing with APM liquid performed before the thermal processing for activating the dopants in the extension regions 28, 36 is set shorter than that for activating the dopant in the deep dopant diffused regions 48, 56.

In the semiconductor device fabrication method according to the present embodiment, the period of time for the cleaning processing with APM liquid performed before the thermal processing of activating the dopants in the extension regions 28, 36 is set shorter than that for activating the dopants in the deep diffused regions 48, 56, whereby when the cleaning processing with APM liquid performed before the thermal processing for activating the dopants in the extension regions 28, 36 is performed, the extension regions 28, 36 are prevent from being largely etched. On the other hand, for the cleaning processing with APM liquid performed before the thermal processing for activating the dopants in the deep dopant diffused regions 48, 56, the cleaning processing with APM liquid is set long for removing particles and organic impurities without failure. At the time of the cleaning processing with APM liquid performed before the thermal processing for activating the dopants in the deep dopant diffused regions 48, 56, parts of the extension regions 28, 36 near the gate electrode 20 are covered with the sidewall insulation film 42, whereby the parts of the extension regions 28, 36 near the gate electrode 20 are prevented from being largely etched, without any problem. Thus, according to the present embodiment, the electric resistance of the extension regions 28, 36 can be low, and semiconductor devices of good electric characteristics can be provided.

[Evaluation Result]

Next, the evaluation result of the semiconductor device fabrication method according to the present embodiment will be explained with reference to FIGS. 8 to 15.

Figure 8:
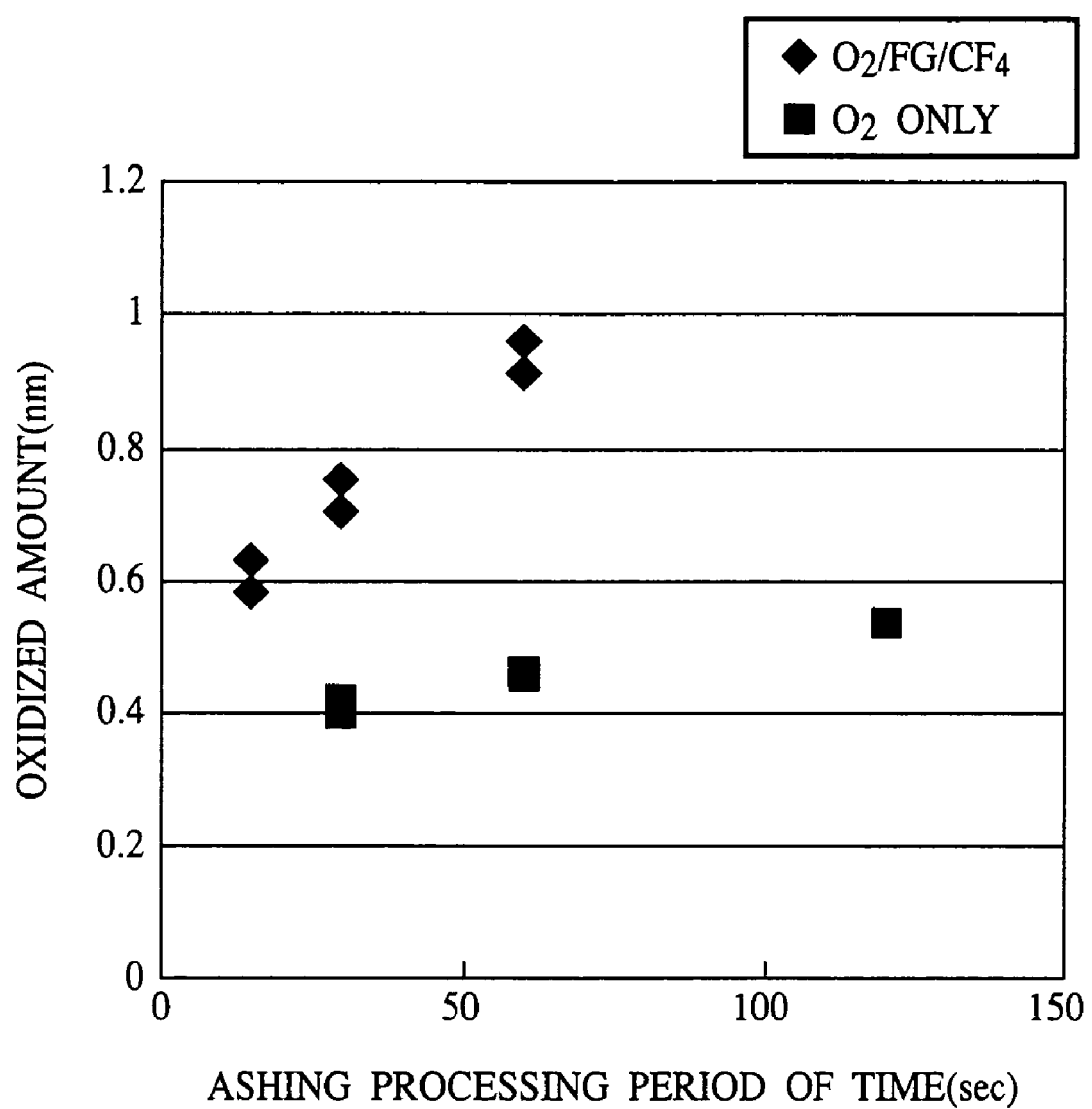
FIG. 8 is sectional views of a semiconductor device in the steps of the semiconductor device fabrication method according to the embodiment of the present invention, which show the method (Part 8).

FIG. 8 is a graph of relationships between periods of time for ashing the photoresist film and oxidized amounts of the semiconductor substrate surface. On the horizontal axis, periods of time for ashing the photoresist film are taken. Oxidized amounts of the semiconductor substrate surface are taken on the vertical axis. "♦" marks indicate the cases using a mixed gas of $O_2$ gas, $CF_4$ gas and a foaming gas for the ashing processing. "■" marks indicate the cases using $O_2$ gas alone for the ashing processing.

As seen in FIG. 8, the oxidized amount tends to increase as the ashing processing period of time is longer. It can be seen that the ashing processing period of time is set short, whereby the oxidized amount can be suppressed to be small.

As seen in FIG. 8, the oxidized amounts of the semiconductor substrate surface differ depending on the gases used in the ashing processing. The oxidized amounts in the ashing processing with $O_2$ gas alone are smaller than those in the ashing processing with the mixed gas.

Figure 9:
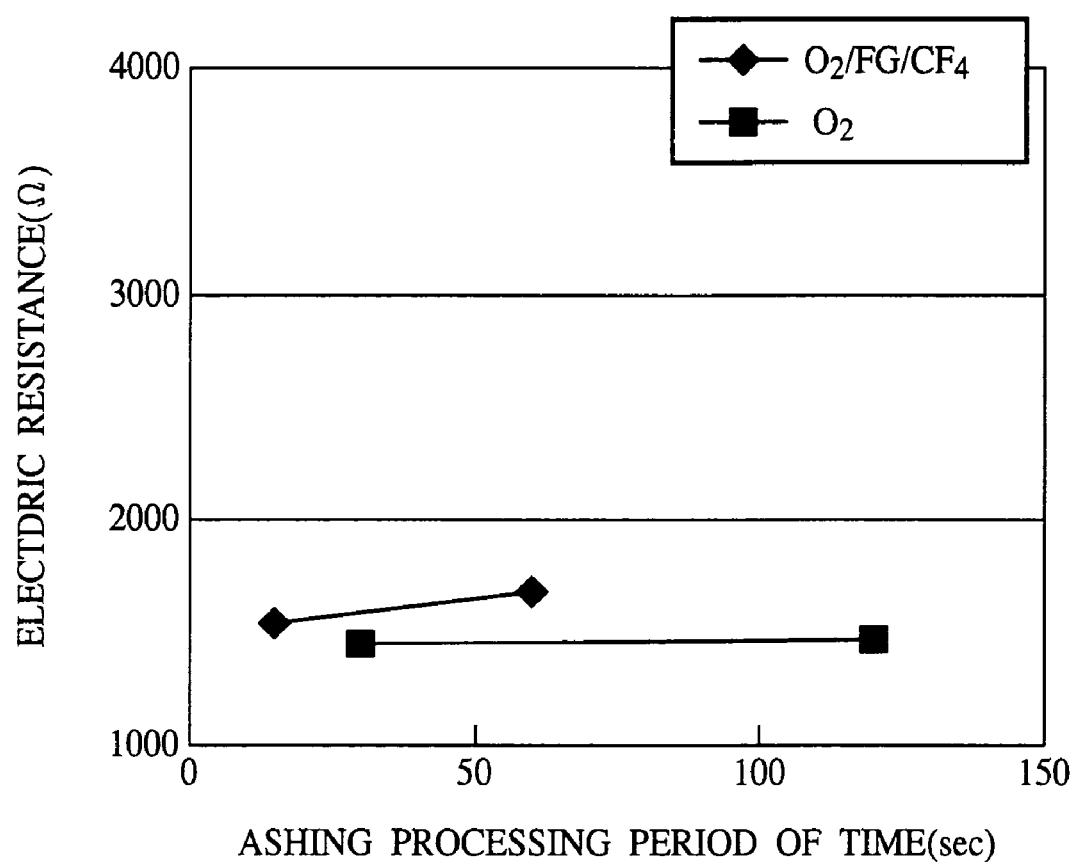
FIG. 9 is a graph of relationships between periods of time for the ashing processing for the photoresist films and electric resistances of the extension region.

FIG. 9 is a graph of relationships between periods of time for ashing the photoresist film and electric resistances of the extension region. Period of time for ashing the photoresist film are taken on the horizontal axis, and electric resistances of the extension region are taken on the vertical axis. "♦" marks indicate the cases using a mixed gas of $O_2$ gas, $CF_4$ gas and a foaming gas for the ashing processing. "■" marks indicate the cases using $O_2$ gas alone for the ashing processing. The extension region was formed under the conditions of boron as the dopant, a 0.3 keV acceleration energy and a $8 \times 10^{14}$ $cm^{-2}$ dose.

As seen in FIG. 9, in the cases using $O_2$ gas alone in the ashing processing, the electric resistance of the extension region is low.

As seen in FIG. 9, as the ashing processing period of time is longer, the electric resistance of the extension region tends to be higher.

As seen in FIGS. 8 and 9, as the ashing processing period of time is shorter, the oxidized amount of the semiconductor substrate surface tends to be smaller, and the electric resistance in the extension region tends to be lower. Based on this, the ashing processing period of time is set short, whereby the electric resistance of the extension region can be low.

Figure 10:
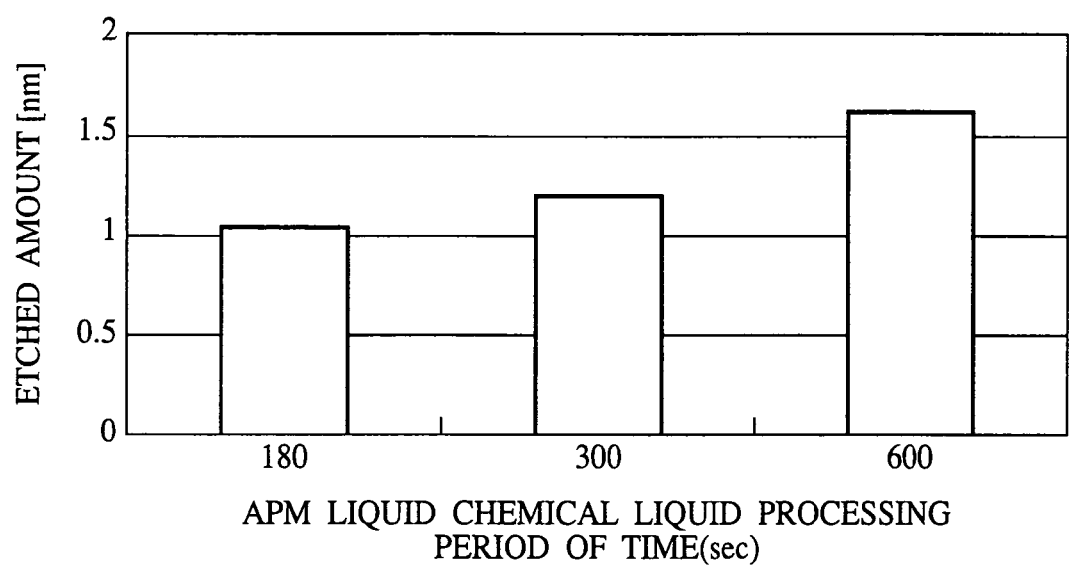
FIG. 10 is a graph of relationships between periods of time for the chemical liquid processing with APM liquid and etched amounts of polysilicon.

FIG. 10 is a graph of relationships between the period of time for the chemical processing with APM liquid and etched amounts of polysilicon. Period of time for the chemical processing with APM liquid are taken on the horizontal axis, and on the vertical axis, etched amounts of the polysilicon are taken.

As seen in FIG. 10, the period of time for the chemical processing with APM liquid is short, whereby large etching of the semiconductor substrate surface can be suppressed.

Figure 11:
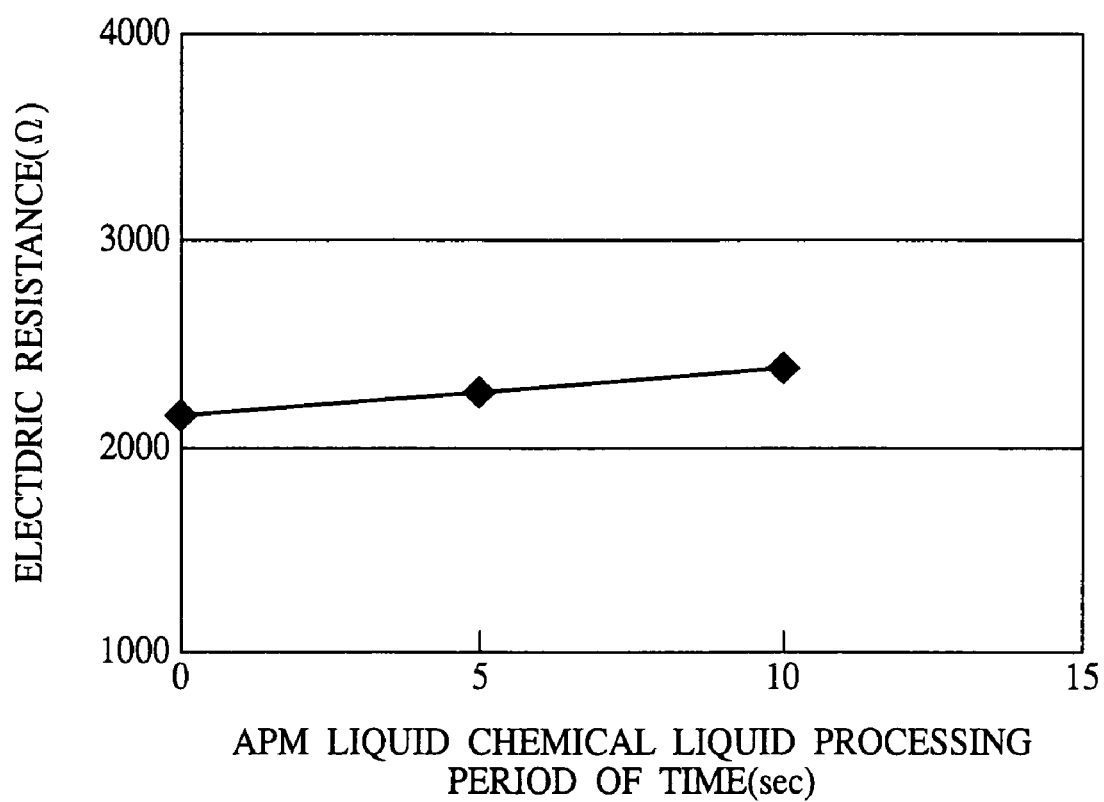
FIG. 11 is a graph of relationships between periods of time for the chemical liquid processing with APM liquid and electric resistances of the extension region.

FIG. 11 is a graph of relationships between periods of time for the chemical processing with APM liquid and the electric resistance of the extension region. Periods of time for the chemical processing with APM liquid are taken on the horizontal axis, and on the vertical axis electric resistances of the extension region are taken. The extension region was formed using boron as the dopant at a 0.2 keV acceleration energy and a $8 \times 10^{14}$ $cm^{-2}$ dose. In the chemical processing, the chemical processing was performed with SPM liquid for 20 minutes, and then the chemical processing with APM liquid followed.

As seen in FIG. 11, the electric resistance of the extension region tends to be lower as the period of time for the chemical processing with APM is shorter.

As seen in FIGS. 10 and 11, as the period of time for the chemical processing with APM liquid is shorter, the etched amount of the semiconductor substrate surface with APM liquid tends to be smaller, and the electric resistance of the extension regions tends to be lower. Based on this, it can be seen that setting the short period of time for the chemical processing with APM liquid can suppress the electric resistance of the extension region to be low.

Figure 12:
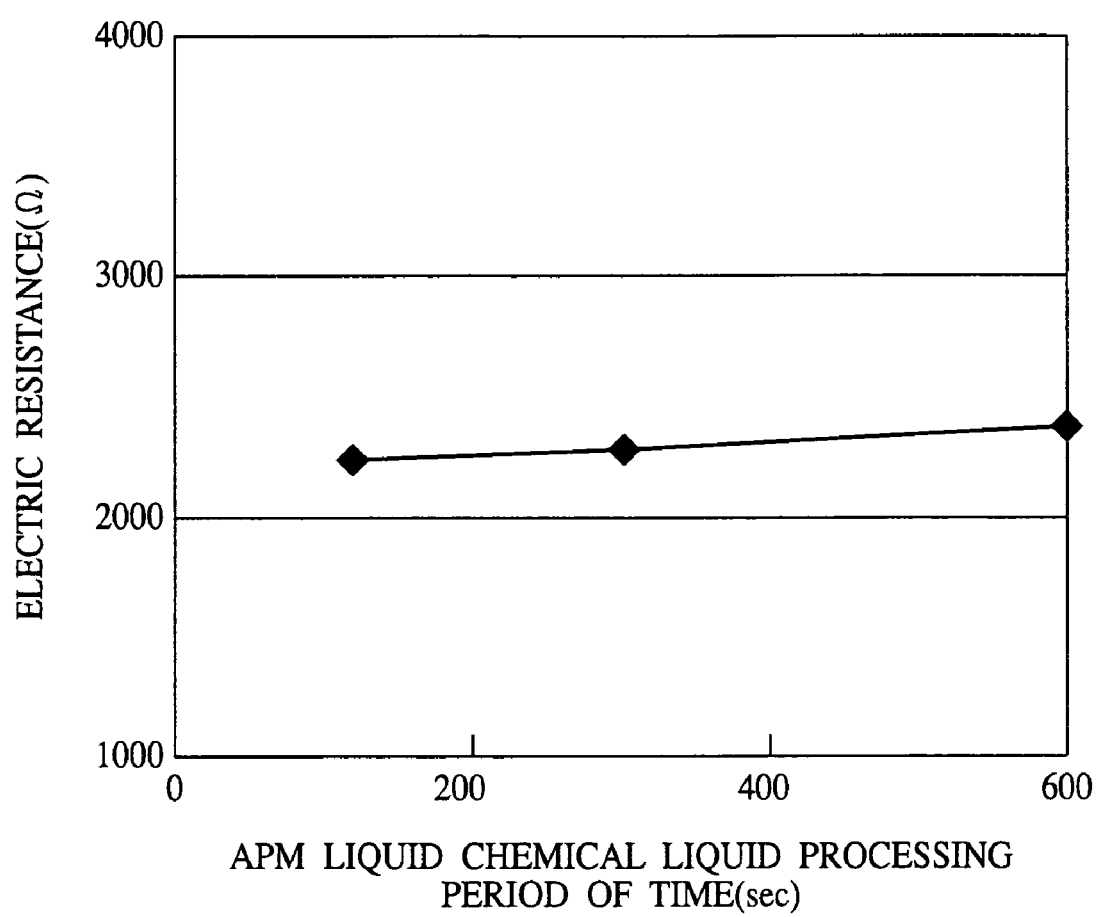
FIG. 12 is a graph of periods of time for the cleaning processing with APM liquid and electric resistances of the extension region.

FIG. 12 is a graph of relationships of periods of time for the cleaning processing with APM liquid in the pre-treatment for the thermal processing for activating a dopant in the extension region, and electric resistances of the extension region. Periods of time form the cleaning processing with APM liquid in the pre-treatment for the thermal processing for activating the dopant in the extension region are taken on the horizontal axis, and electric resistances of the extension region are taken on the vertical axis.

As seen in FIG. 12, the electric resistance of the extension region tends to be smaller as the period of time for the cleaning with APM liquid is shorter.

Figure 13:
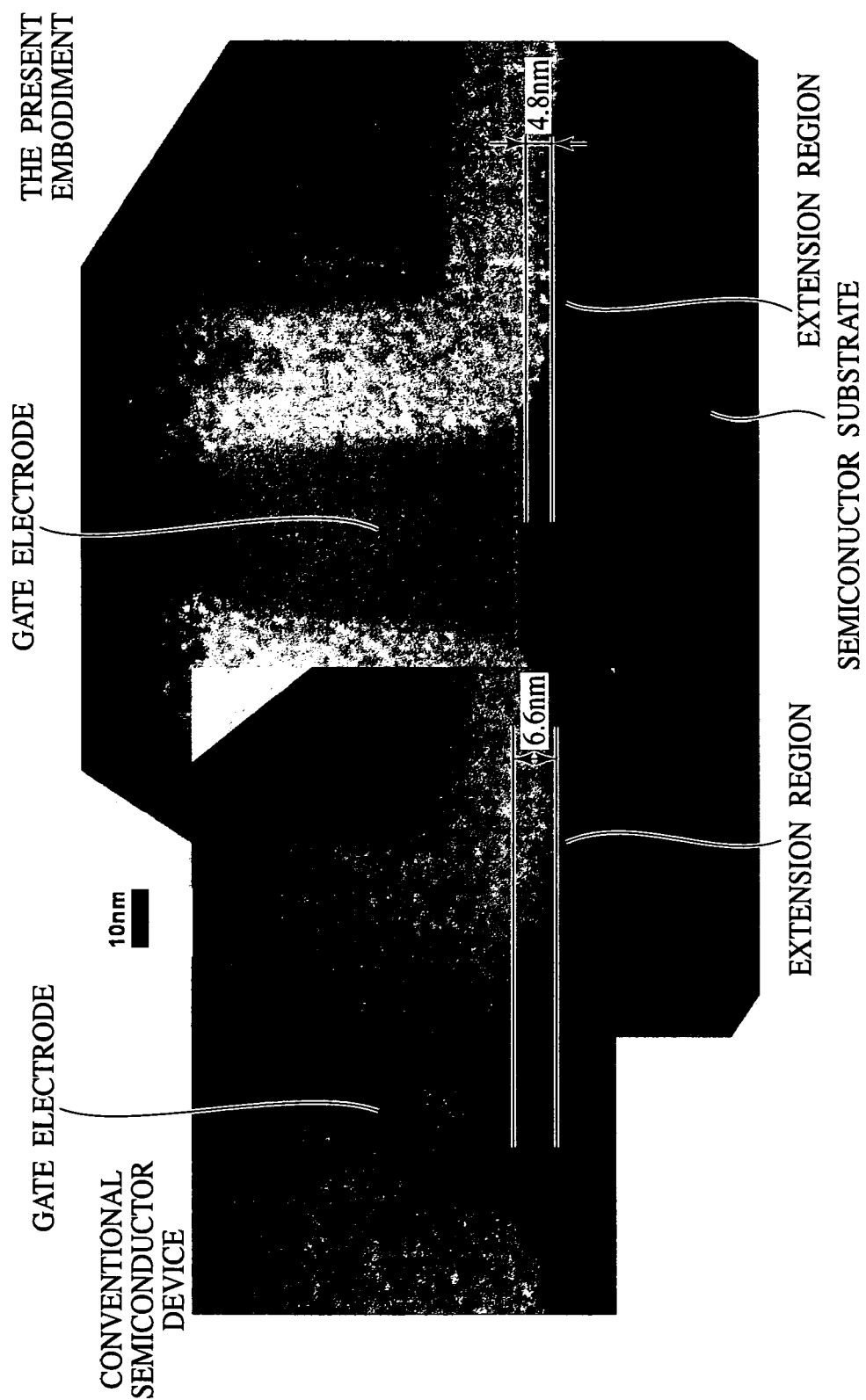
FIG. 13 is sectional views, for comparison, of the semiconductor device of the embodiment of the present invention and the conventional semiconductor device.

FIG. 13 is sectional views of the semiconductor device of the present embodiment and the conventional semiconductor device for comparison. FIG. 13 is a TEM (transmission electron microscope) picture. On the left side of drawing of FIG. 13, the conventional semiconductor device is shown. On the right side of the drawing of FIG. 13, the semiconductor device of the present embodiment is shown.

As seen in FIG. 13, in the conventional semiconductor device, the height of the surface of the semiconductor substrate of the extension region is lower by 6.6 nm than the height of the surface of the semiconductor substrate right below the gate electrode.

In contrast to this, in the semiconductor device of the present embodiment, the height of the surface of the semiconductor substrate 10 of the extension region 28 is lower by 4.8 nm than the height of the surface of the semiconductor substrate 10 right below the gate electrode 20. That is, in the present embodiment, the etched amount of the extension region 28 is suppressed by about 30% in comparison with that of the conventional semiconductor device fabrication method.

Based on this, it can be seen that the present embodiment can suppress the etching of the extension region.

Figure 14:
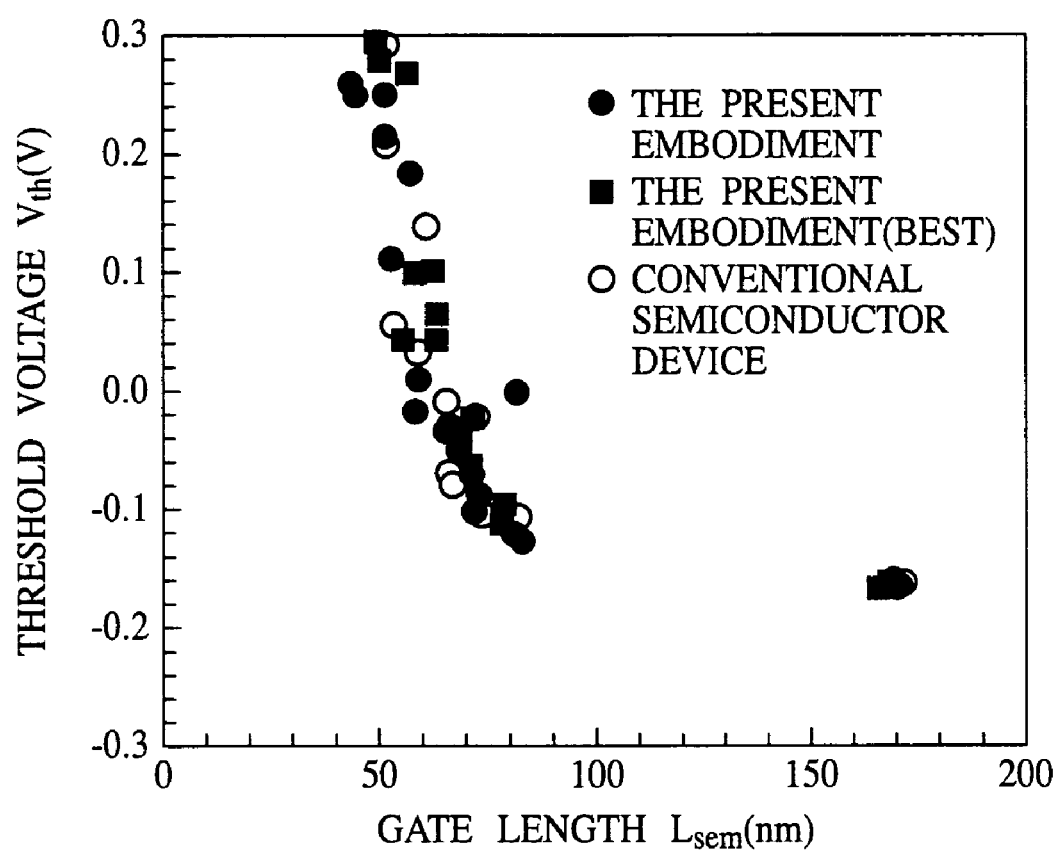
FIG. 14 is a graph of the roll-off characteristics.

FIG. 14 is a graph of roll-off characteristics. Gate lengths $L_{sem}$ are taken on the horizontal axis. Threshold voltages $V_{th}$ are taken on the vertical axis. The drain voltage $V_d$ for measuring the roll-off characteristics was −1 V. " "marks indicate cases of the semiconductor device of the present embodiment. "■" marks indicate cases of those of the semiconductor device of the present embodiment having the best characteristics. "○" marks indicate cases of the conventional semiconductor device.

As seen in FIG. 14, the semiconductor device of the present embodiment have good roll-off characteristics, as does the conventional semiconductor device.

Figure 15:
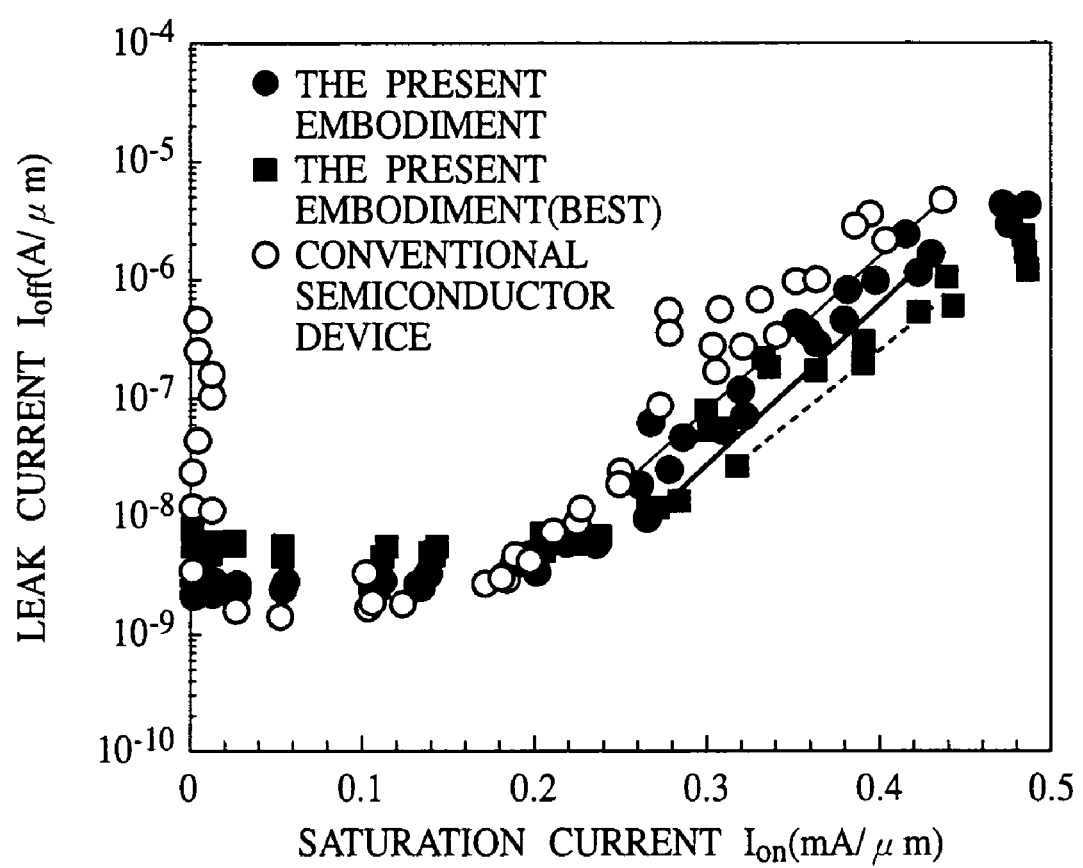
FIG. 15 is a graph of relationships between the saturation currents and the leak currents.

FIG. 15 is a graph of relationships between saturation currents $I_{on}$ and leak currents $I_{off}$. Saturation currents $I_{on}$ are taken on the horizontal axis, and leak currents $I_{off}$ are taken on the vertical axis. "●" marks indicate cases of the semiconductor device of the present embodiment. "■" marks indicate cases of those of the present embodiment, having the best characteristics. "○" marks indicate cases of the conventional semiconductor device.

As seen in FIG. 15, the present embodiment can provide large saturation currents in comparison with the conventional semiconductor device.

[Modified Embodiments]

The present invention is not limited to the above-described embodiments and can cover other various modifications.

For example, the chemical processing period of time for removing the photoresist films 22, 30 with APM liquid is set shorter. However, the principle of the present invention is not limited to removing the photoresist films 22, 30 with APM liquid. The present invention is applicable to removing the photoresist films 22, 30 with chemical liquid other than APM liquid.

In the above-described embodiment, the period of time for the cleaning processing with APM liquid in the pre-treatment for the thermal processing for activating the dopant in the extension region is set shorter. However, the principle of the present invention is not limited to the cleaning processing with APM liquid. The present invention is applicable to cleaning the surface of the semiconductor substrate 10 with chemical liquids other than APM liquid.

In the above-described embodiment, the photoresist films are released with a mixed gas of the reaction gas of $O_2$ gas, another reaction gas of $CF_4$ and a foaming gas. Said another reaction gas is not limited to $CF_4$ and can be a gas which can accelerate the release of the photoresist films. For example, said another reaction gas can be suitably a gas containing fluorine atoms or hydrogen atoms. Specifically, as said another reaction gas, other than $CF_4$ gas, $H_2$ gas, $NF_3$ gas, $H_2O$ gas, $CHF_3$ gas or others can be used.

What is claimed is:

1. A method for fabricating a semiconductor device comprising:
   the step of forming gate electrodes respectively in a first element region and in a second element region which are formed over a semiconductor substrate, with a gate insulation film formed therebetween;
   the step of forming a first resist film over the semiconductor substrate and the gate electrodes, the first resist film being opened in the first element region;
   the step of implanting a dopant in the first element region with the first resist film and the gate electrodes as a mask to form a first dopant diffused region;
   the first ashing processing step of ashing the first resist film;
   the step of forming a sidewall insulation film over the side wall of the gate electrode;
   the step of forming a second resist film over the semiconductor substrate, the gate electrode and the sidewall insulation film, the second resist film being opened in the second element region;
   the step of implanting a dopant in the first element region with the second resist film, the gate electrode and the sidewall insulation film as a mask to form a second dopant diffused region; and
   the second ashing processing step of ashing the second resist film,
   an ashing processing period of time in the first ashing processing step being shorter than an ashing processing period of time in the second ashing processing step.

2. A method for fabricating a semiconductor device according to claim 1, wherein
   the ashing processing period of time in the first ashing processing step is below 0.7 times the ashing processing period of time in the second ashing processing step.

3. A method for fabricating a semiconductor device according to claim 2, wherein
   the ashing processing period of time in the first ashing processing step is below 0.5 times the ashing processing period of time in the second ashing processing step.

4. A method for fabricating a semiconductor device comprising:
   the step of forming gate electrodes respectively in a first element region and in a second element region which are formed over a semiconductor substrate, with a gate insulation film formed therebetween;
   the step of forming a first resist film over the semiconductor substrate and the gate electrodes, the first resist film being opened in the first element region;
   the step of implanting a dopant in the first element region with the first resist film and the gate electrodes as a mask to form a first dopant diffused region;
   the first ashing processing step of ashing the first resist film with a reaction gas of oxygen;
   the step of forming a sidewall insulation film over the side wall of the gate electrode;
   the step of forming a second resist film over the semiconductor substrate, the gate electrode and the sidewall insulation film, the second resist film being opened in the second element region;
   the step of implanting a dopant in the first element region with the second resist film, the gate electrode and the sidewall insulation film as a mask to form a second dopant diffused region; and
   the second ashing processing step of ashing the second resist film with a mixed gas mixing a reaction gas of oxygen and another reaction gas.

5. A method for fabricating a semiconductor device according to claim 4, wherein
   said another reaction gas is a gas containing a fluorine atom and a hydrogen atom.

6. A method for fabricating a semiconductor device according to claim 4, wherein
   the mixed gas further contains a foaming gas.

7. A method for fabricating a semiconductor device comprising:
   the step of forming gate electrodes respectively in a first element region and in a second element region which are formed over a semiconductor substrate, with a gate insulation film formed therebetween;
   the step of forming a first resist film over the semiconductor substrate and the gate electrodes, the first resist film being opened in the first element region;
   the step of implanting a dopant in the first element region with the first resist film and the gate electrodes as a mask to form a first dopant diffused region;
   the first ashing processing step of ashing the first resist film;
   the first chemical processing step of removing the first resist film with a chemical liquid;
   the step of forming a sidewall insulation film over the side wall of the gate electrode;
   the step of forming a second resist film over the semiconductor substrate, the gate electrode and the sidewall insulation film, the second resist film being opened in the first element region;
   the step of implanting a dopant in the first element region with the second resist film, the gate electrode and the sidewall insulation film as a mask to form a second dopant diffused region;
   the second ashing processing step of ashing the second resist film; and
   the second chemical processing step of removing the second resist film with a chemical liquid,
   a chemical liquid processing period of time in the first chemical liquid processing step being shorter than a chemical liquid processing period of time in the second chemical liquid processing step.

8. A method for fabricating a semiconductor device according to claim 7, wherein
   the chemical liquid processing period of time in the first chemical liquid processing step is below 0.7 times the chemical liquid processing period of time in the second chemical liquid processing step.

9. A method for fabricating a semiconductor device according to claim 8, wherein
the chemical liquid processing period of time in the first chemical liquid processing step is below 0.5 times the chemical liquid processing period of time in the second chemical liquid processing step.

10. A method for fabricating a semiconductor device according to claim 7, wherein
in the first chemical liquid processing step, the first resist film is removed with a chemical liquid mixing ammonia, hydrogen peroxide and water; and
in the second chemical liquid processing step, the second resist film is removed with a chemical liquid mixing ammonia, hydrogen peroxide and water.

11. A method for fabricating a semiconductor device according to claim 7, further comprising:
the third chemical liquid processing step of removing the first resist film with a chemical liquid mixing sulfuric acid and hydrogen peroxide after the first ashing processing step and before the first chemical liquid processing step; and
the fourth chemical liquid processing step of removing the second resist film with a chemical liquid mixing sulfuric acid and hydrogen peroxide after the second ashing processing step and before the second chemical liquid processing step.

12. A method for fabricating a semiconductor device comprising:
the step of forming a gate electrode over a semiconductor substrate with a gate insulation film formed therebetween;
the step of implanting a dopant in the semiconductor substrate with the gate electrode with a mask to form a first dopant diffused region in the semiconductor substrate on both sides of the gate electrode;
the first cleaning processing step of cleaning the substrate with a chemical liquid;
the first thermal processing step of performing thermal processing to activate the dopant in the first dopant in the first dopant diffused region;
the step of forming a sidewall insulation film over the side wall of the gate electrode;
the step of implanting a second dopant in the semiconductor substrate with the gate electrode and the sidewall insulation film as a mask to form a second dopant diffused region;
the second cleaning processing step of cleaning the semiconductor substrate with a chemical liquid; and
the second thermal processing step of performing thermal processing for activating the second dopant in the second dopant diffused region,
a cleaning processing period of time in the first cleaning processing step being shorter than a cleaning processing period of time in the second cleaning processing step.

13. A method for fabricating a semiconductor device according to claim 12, wherein
the cleaning processing period of time in the first cleaning processing step is below 0.7 times the cleaning processing period of time in the second cleaning processing step.

14. A method for fabricating a semiconductor device according to claim 13, wherein
the cleaning processing period of time in the first cleaning processing step is below 0.5 times the cleaning processing period of time in the second cleaning processing step.

15. A method for fabricating a semiconductor device according to claim 12, wherein
the semiconductor substrate is cleaned with a chemical liquid mixing ammonia, hydrogen peroxide and water respectively in the first cleaning processing step and the second cleaning processing step.

16. A method for fabricating a semiconductor device according to claim 12, further comprising:
the third cleaning processing step of cleaning the semiconductor substrate with a chemical liquid mixing hydrochloric acid, hydrogen peroxide and water, after the step of forming a first dopant diffused region and before the first cleaning processing step, or after the first cleaning processing step and before the first thermal processing step; and
the fourth cleaning processing step of cleaning the semiconductor substrate with a chemical liquid mixing hydrochloric acid, hydrogen peroxide and water, after the step of forming a second dopant diffused region and before the second cleaning processing step, or after the second cleaning processing step and before the second thermal processing step.

* * * * *